United States Patent
Asadi et al.

(10) Patent No.: US 11,206,043 B2
(45) Date of Patent: Dec. 21, 2021

(54) BIT-FLIPPING DECODER ARCHITECTURE FOR IRREGULAR QUASI-CYCLIC LOW-DENSITY PARITY-CHECK CODES

(71) Applicant: SK hynix Inc., Gyeonggi-do (KR)

(72) Inventors: Meysam Asadi, Fremont, CA (US); Fan Zhang, Fremont, CA (US); Aman Bhatia, Los Gatos, CA (US); Xuanxuan Lu, San Jose, CA (US); Haobo Wang, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 59 days.

(21) Appl. No.: 16/781,913

(22) Filed: Feb. 4, 2020

(65) Prior Publication Data
US 2021/0242882 A1 Aug. 5, 2021

(51) Int. Cl.
*G11C 29/00* (2006.01)
*H03M 13/11* (2006.01)
*H03M 13/00* (2006.01)
*G06F 11/10* (2006.01)

(52) U.S. Cl.
CPC ..... *H03M 13/1108* (2013.01); *G06F 11/1068* (2013.01); *H03M 13/116* (2013.01); *H03M 13/6502* (2013.01)

(58) Field of Classification Search
CPC ......... H03M 13/1108; H03M 13/6502; H03M 13/116; G06F 11/1068
See application file for complete search history.

(56) References Cited

U.S. PATENT DOCUMENTS 8,321,747 B2  11/2012  Bai et al.
2011/0126078 A1*  5/2011  Ueng ................. H03M 13/1111
                                                          714/755

OTHER PUBLICATIONS

Zhang et al. High-Throughput Layered Decoder Implementation for Quasi-Cyclic LDPC Codes. Aug. 2009. IEEE Journal on selected areas in communications. vol. 27, No. 6, pp. 985-994.*
Payaro, M. et al., "Flex5Gware: Flexible and efficient hardware and software platforms for 5G network elements and devices," Trans. Emerging Tel. Tech., 2016, 8 pages.

* cited by examiner

*Primary Examiner* — Samir W Rizk
(74) *Attorney, Agent, or Firm* — Perkins Coie LLP

(57) ABSTRACT

Devices, systems and methods for reducing complexity of a bit-flipping decoder for quasi-cyclic (QC) low-density parity-check (LDPC) codes are described. An example method includes receiving a noisy codeword that is based on a transmitted codeword generated from an irregular QC-LDPC code, the irregular QC-LDPC code having an associated parity matrix, storing, based on a weight of a plurality of columns of the parity matrix of the irregular QC-LDPC code, a portion of the noisy codeword corresponding to the plurality of columns in a first buffer of a plurality of buffers, and accessing and processing the portion of the noisy codeword that includes applying a vertically shuffled scheduling (VSS) scheme that uses a plurality of processing units to determine a candidate version of a portion of the transmitted codeword that corresponds to the portion of the noisy codeword.

20 Claims, 9 Drawing Sheets

BIT-FLIPPING DECODER ARCHITECTURE FOR IRREGULAR QUASI-CYCLIC LOW-DENSITY PARITY-CHECK CODES

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, the multi-level NAND flash devices can be inherently unreliable and generally need to use ECCs to allow dramatic increase in data reliability at the expense of extra storage space for ECC parity bits. There is a demand for increasingly efficient ECCs that can provide data protection with lower complexity.

SUMMARY

Embodiments of the disclosed technology relate to a bit-flipping decoder for irregular quasi-cyclic (QC) low-density parity-check (LDPC) codes. The methods, systems and devices described in the present document advantageously, among other features and benefits, reduce the complexity of implementations of bit-flipping decoders for irregular QC-LDPC codes.

In an example aspect, a method for reducing complexity of a bit-flipping decoder for QC-LDPC codes includes receiving a noisy codeword that is based on a transmitted codeword generated from an irregular quasi-cyclic low-density parity-check (QC-LDPC) code, the irregular QC-LDPC code having an associated parity matrix, storing, based on a weight of a plurality of columns of the parity matrix of the irregular QC-LDPC code, a portion of the noisy codeword corresponding to the plurality of columns in a first buffer of a plurality of buffers, and accessing and processing the portion of the noisy codeword that includes applying a vertically shuffled scheduling (VSS) scheme that uses a plurality of processing units to determine a candidate version of a portion of the transmitted codeword that corresponds to the portion of the noisy codeword, wherein the processing comprises a performing a message passing algorithm between a plurality of variable nodes and a plurality of check nodes that represent the parity matrix of the irregular QC-LDPC code, wherein the VSS scheme processes each of the variable nodes one by one in each iteration of the message passing algorithm, and wherein a number of the plurality of processing units is based on a distribution of column weights in the parity matrix.

In another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Solid state drives (SSDs) are a new generation of storage device used in computers. SSDs replace traditional mechanical hard disks by using flash-based memory, which is significantly faster. SSDs speed up computers significantly due to their low read-access times and fast throughputs. SSDs typically use LDPC codes to correct any bit-errors in pages read from NAND media. For typical SSD applications, most page reads (more than 99%) are by the bit-flipping decoder. Thus, designing hardware for fast and efficient bit-flipping (BF) decoder is critical especially in mobile and client SSD applications because of their strict power constraints and throughput requirements.

FIGS. 1-6 overview a non-volatile memory system (e.g., a flash-based memory that is used in an SSD) in which embodiments of the disclosed technology may be implemented.

Figure 1:
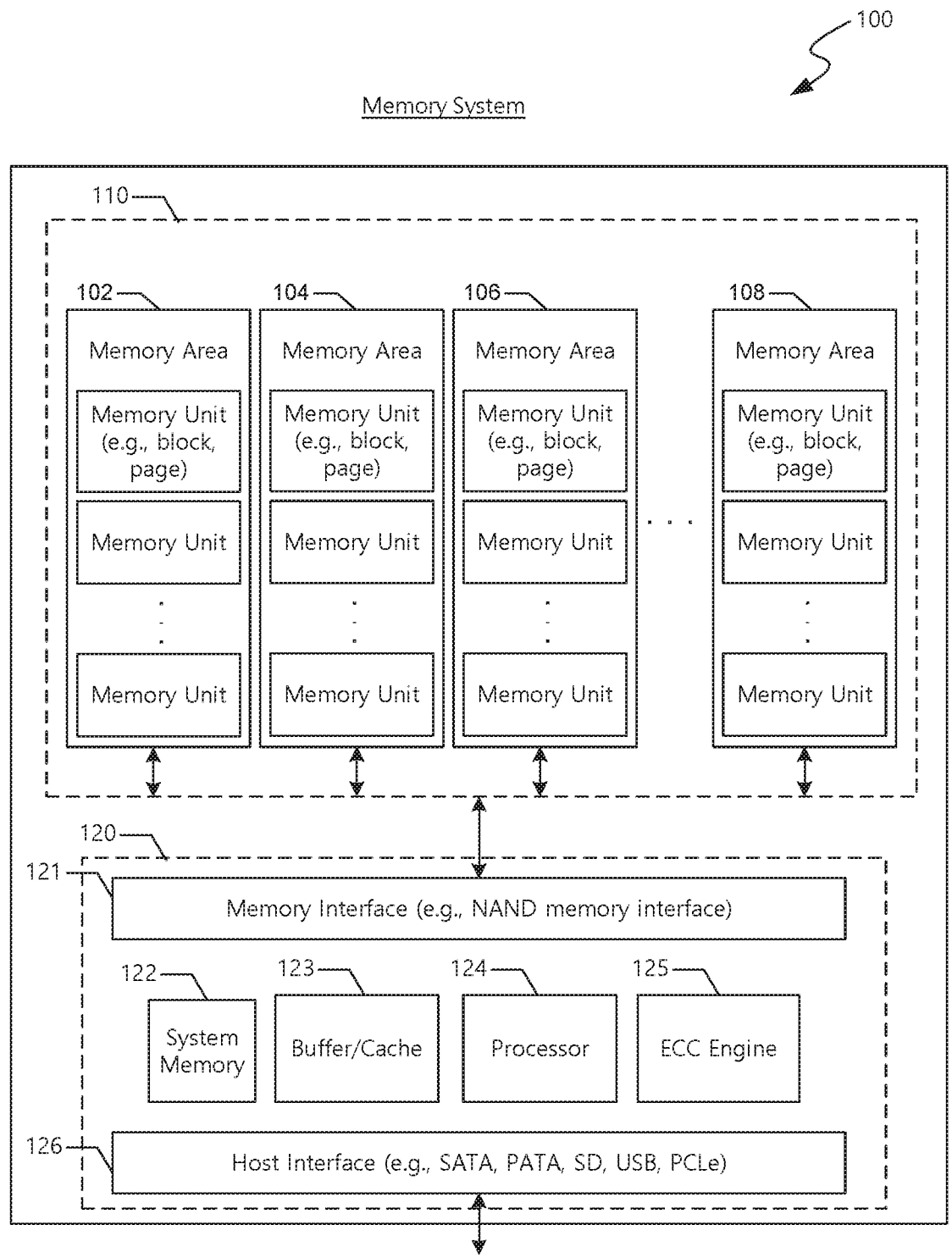
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
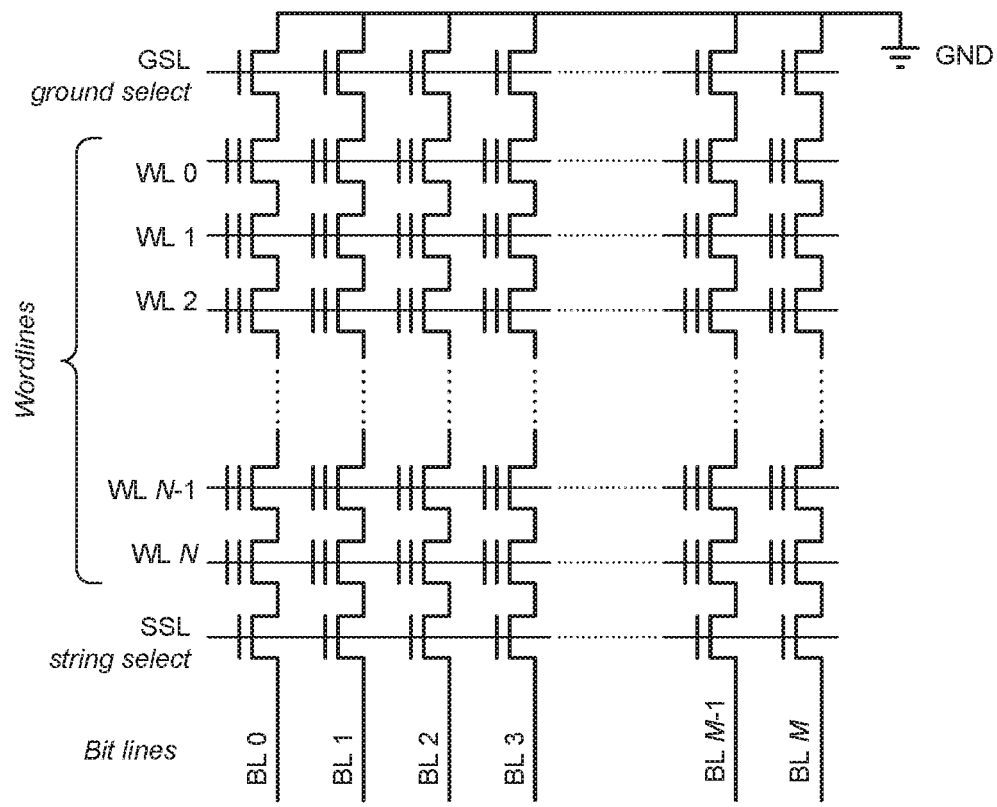
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
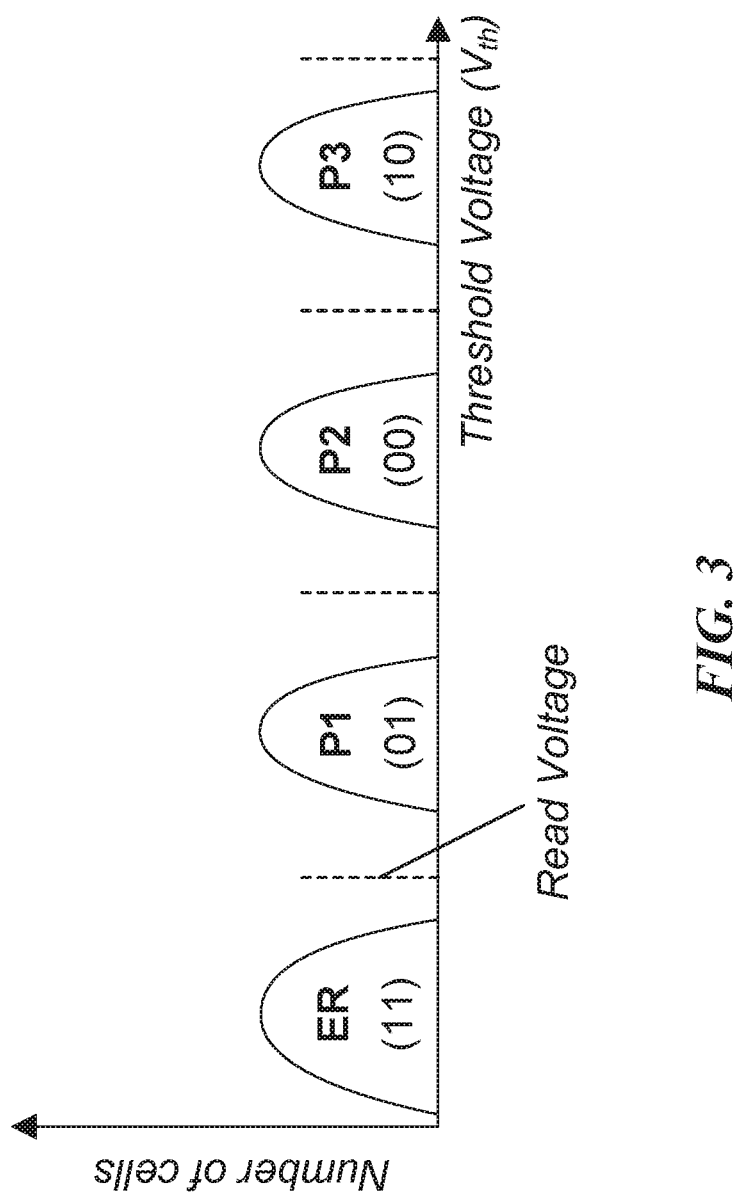
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
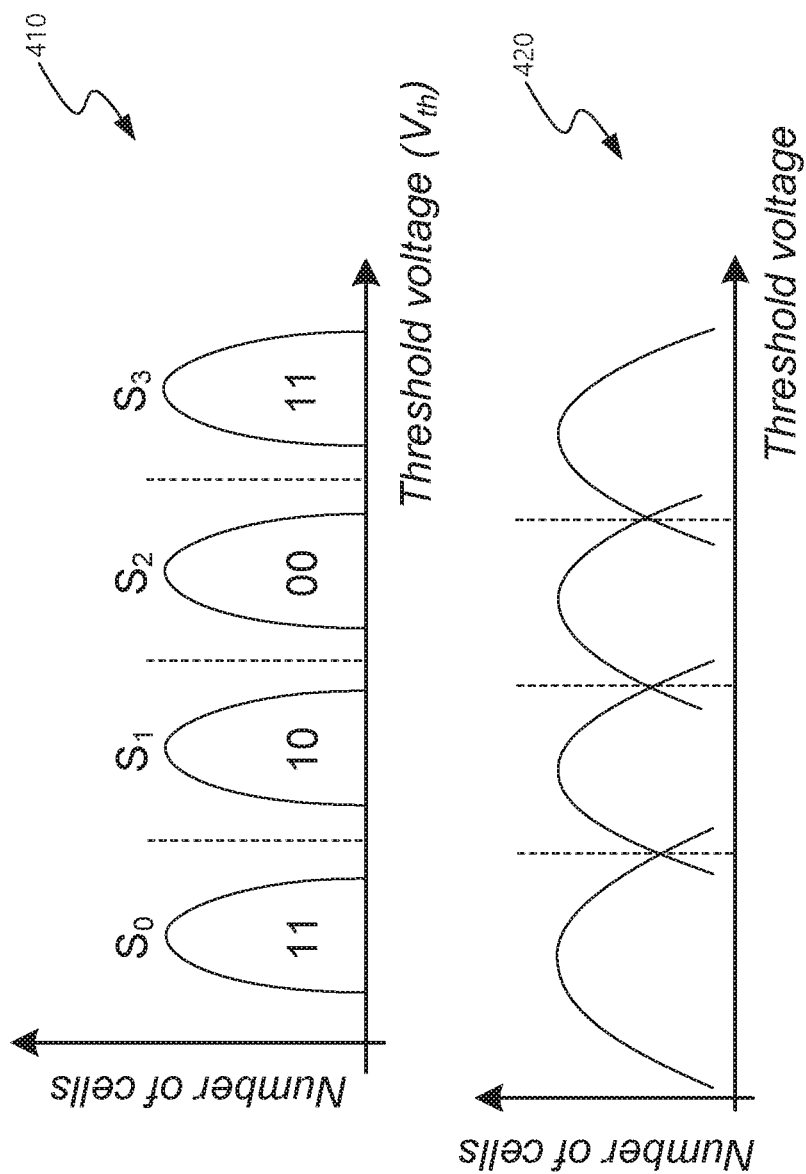
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
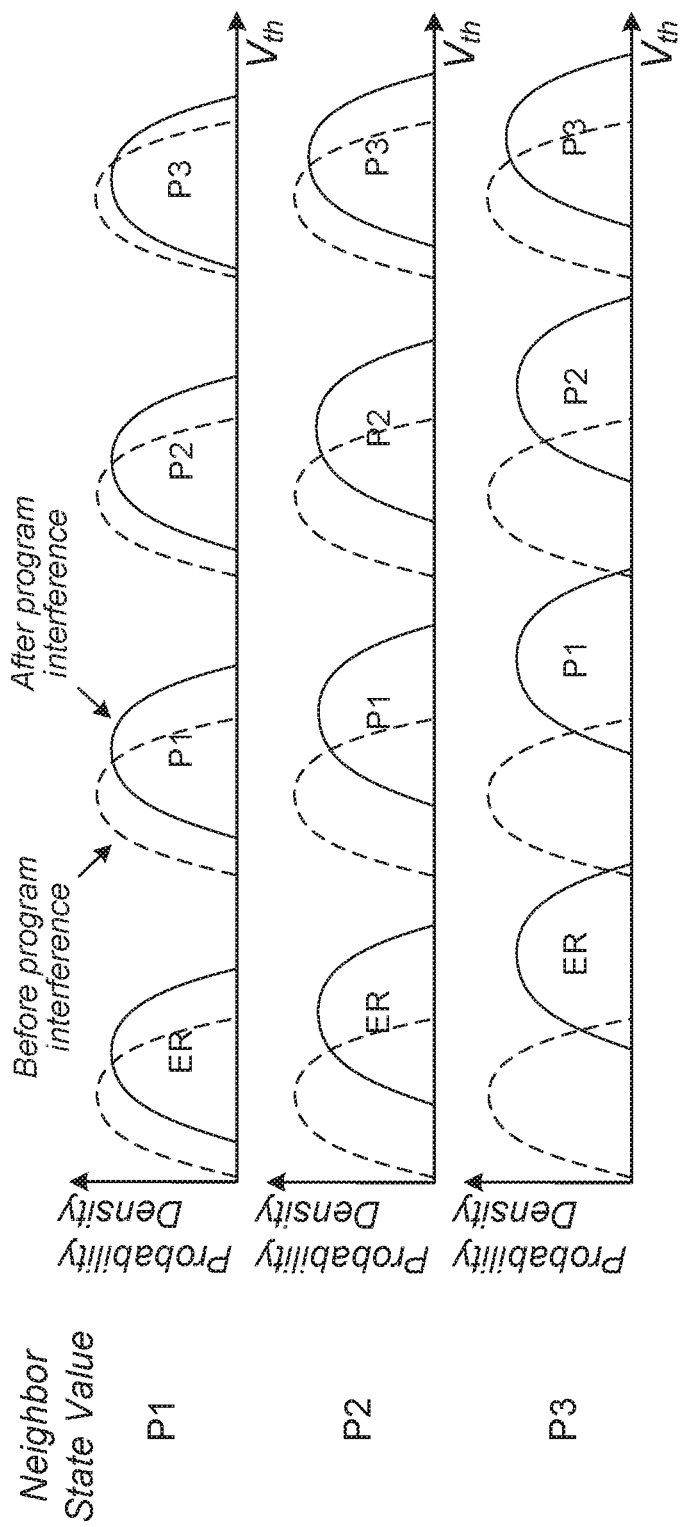
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell inference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
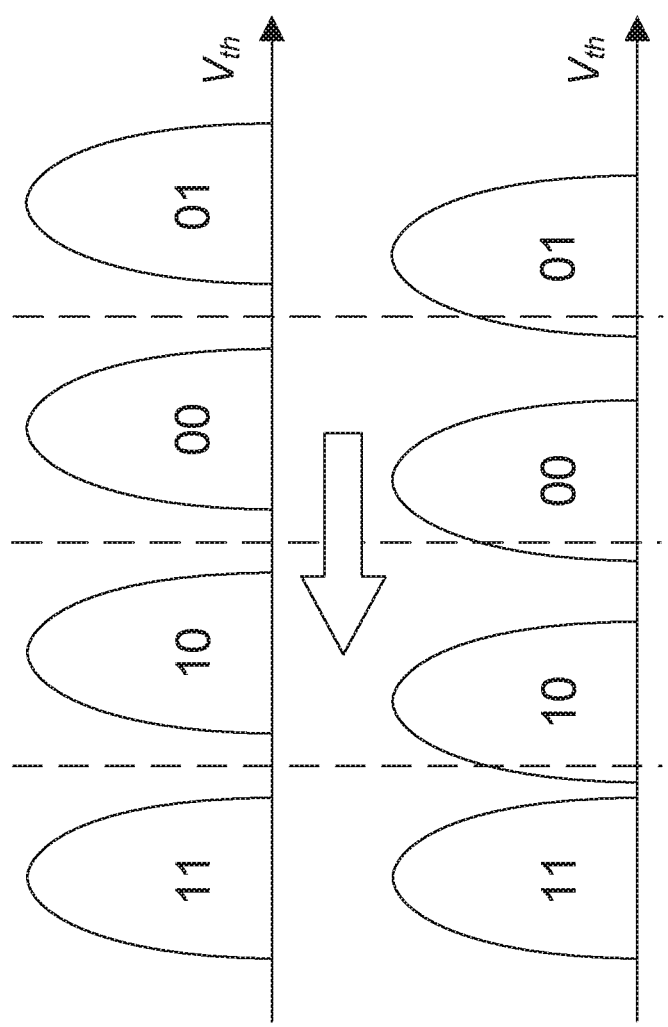
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

Embodiments of the disclosed technology include methods, systems and devices that reduce the complexity of bit-flipping decoder implementations for QC-LDPC codes, which are used in non-volatile memory devices (e.g., as described in FIGS. 1-6) that constitute SSDs. In an example, the implementation complexity is reduced by using a memory architecture that can be configured to use a variable processing speed to enable decoding irregular QC-LDPC codes.

Quasi-cyclic codes are defined by the property that, for an integer no, every cyclic shift of a codeword by no places is also a codeword. For a systematic ($n=mn_0$, $k=mk_0$) quasi-cyclic linear code, the corresponding parity check matrix H is represented as:

$$H = \begin{bmatrix} & C'_{1,1} & C'_{1,2} & \cdots & C'_{1,k_0} \\ & C'_{2,1} & C'_{2,2} & \cdots & C'_{2,k_0} \\ I_{n-k} & C'_{3,1} & C'_{3,2} & \cdots & C'_{3,k_0} \\ & \vdots & \vdots & & \vdots \\ & C'_{n_0-k_0,1} & C'_{n_0-k_0,2} & \cdots & C'_{n_0-k_0,k_0} \end{bmatrix}$$

Herein, $I_{n-k}$ represents an $(n-k) \times (n-k)$ identity matrix, and each $C'_{i,j}$ is a m×m circulant matrix (with size circulantSize or circSize) of the following form:

$$C'_{i,j} = \begin{bmatrix} c_0 & c_1 & c_2 & \cdots & c_{m-1} \\ c_{m-1} & c_0 & c_1 & \cdots & c_{m-2} \\ c_{m-1} & c_{m-1} & c_0 & \cdots & c_{m-3} \\ \vdots & \vdots & \vdots & & \vdots \\ c_1 & c_2 & c_3 & \cdots & c_0 \end{bmatrix}.$$

In contrast to a quasi-cyclic code in which all columns have an equal column weight (e.g., each column has the same number of 1's), an irregular quasi-cyclic code has at least two columns with different numbers of 1's, i.e., columns with different weights.

Both regular and irregular LDPC codes can be represented using a Tanner graph, which includes a set of nodes (or vertices) and a set of edges connecting the nodes. The Tanner graph corresponding to an M×N parity-check matrix contains M variable nodes (or bit nodes) and N check nodes (or check sum nodes), and provides a graphical representation of the parity-check matrix to which is corresponds. The performance and decoding of an LDPC code (regular or irregular) are based on the row-weights and column-weights of the parity-check matrix, or equivalently, the cycles in the Tanner graph representation.

Figure 7:
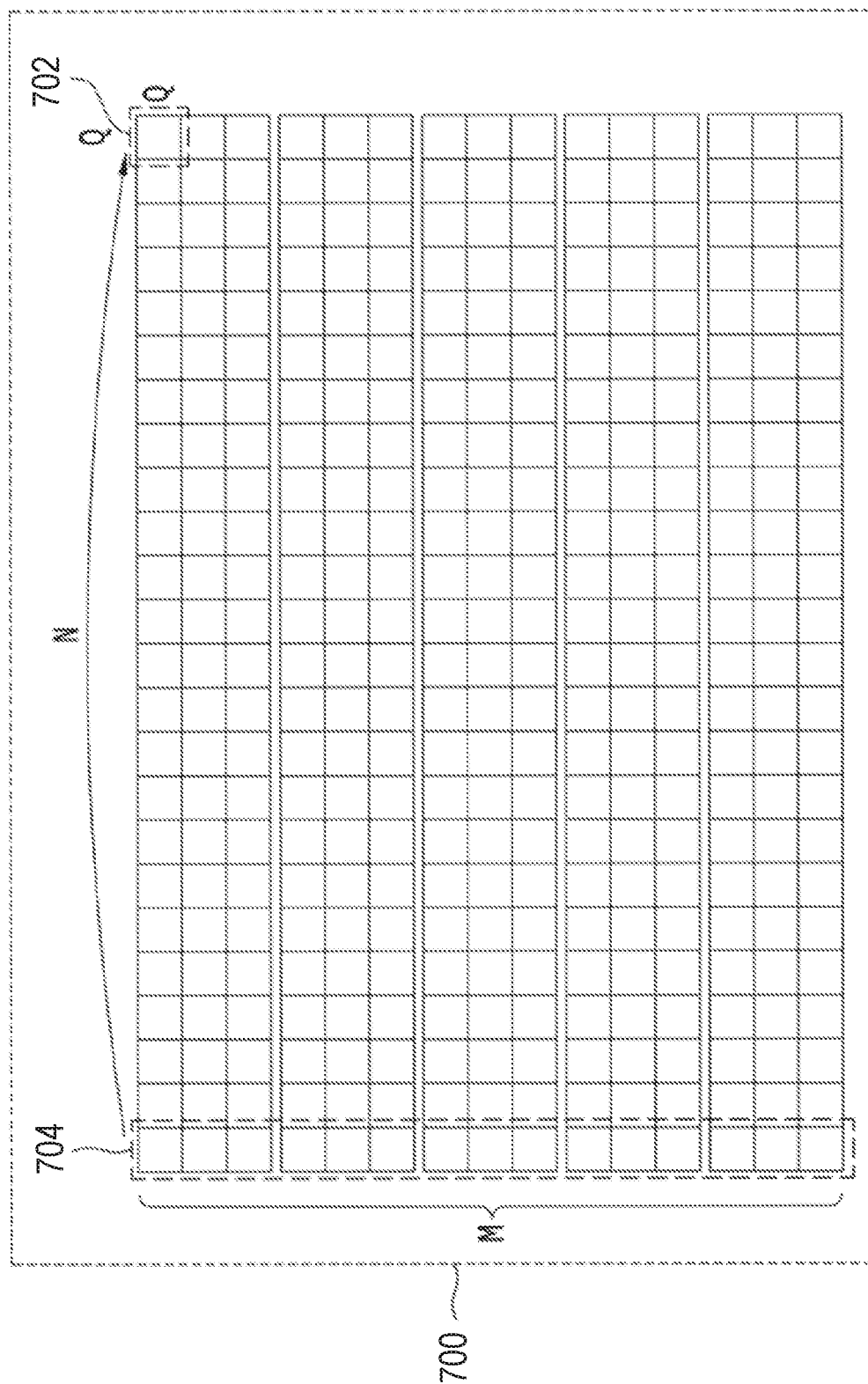
FIG. 7 illustrates an example of a parity-check matrix and a vertically shuffled scheduling (VSS) scheme.

FIG. 7 illustrates an example of a parity-check matrix and a vertically shuffled scheduling (VSS) scheme. As illustrated therein, the parity check matrix 700 may include M×N sub-matrices 702, wherein each of the sub-matrices 702 may be a zero matrix or a cyclically shifted identity matrix of size Q×Q (in the case of a regular QC-LDPC code). Each entry of the parity check matrix 700 defining a binary LDPC code is either 0 or 1.

As discussed above, the structure of the LDPC code may be defined by a Tanner graph formed of check nodes, variable nodes, and edges connecting the check nodes and the variable nodes. The check nodes and the variable nodes forming the Tanner graph may correspond to the rows and columns of the parity check matrix 700, respectively. Therefore, the number of the rows of the parity check matrix 700 and the number of the columns of the parity check matrix 700 may correspond to the number of the check nodes and the number of the variable nodes that form the Tanner graph, respectively. When the entry of the parity check matrix 700 is 1, the check node and the variable node which correspond to the row and the column where the entry is positioned may be connected by an edge on the Tanner graph.

In some embodiments, an LDPC decoding operation is performed according to the bit flipping algorithm in a vertically shuffled scheduling (VSS) scheme. According to the VSS scheme, sub-matrices 704 that share the same layer (or layer index) among a plurality of sub-matrices 702 forming the parity check matrix 700 are selected, and a variable node selecting operation is performed that includes selecting variable nodes that correspond to the columns forming the selected sub-matrices. Variable node messages from the selected variable nodes are provided to the check nodes connected to the selected variable nodes. A check node updating operation is performed based on the provided variable node messages for the check nodes provided with the variable node messages. The check nodes performing the check node updating operation provides the check node message to the variable nodes connected to the check nodes. A variable node updating operation on the variable nodes provided with the check node messages is performed based on the provided check node messages. The LDPC decoding operation in the vertically shuffled scheduling method is performed by repeatedly performing the variable node selecting operation, the check node updating operation, and the variable node updating operation, until the LDPC decoding operation is performed successfully.

In some embodiments, the VSS scheme processes the variable nodes one by one in each iteration, i.e., for each variable node, the check nodes that are connected to that variable nodes are processed before the next variable node is processed. This is different from the more traditional horizontally shuffled scheduling (HSS) scheme, which processes all the variable nodes and then all the parity nodes in each iteration. The VSS scheme typically results in better convergence in an iterative receiver for LDPC codes.

Typically, bit-flipping decoders for a regular QC-LDPC code process a fixed number of circulant-columns in one cycle so that the throughput requirements are met with the least possible silicon area and power. For example, a regular LDPC code with a maximum column weight of 5 may use a BF decoder to meet the throughput, power and area constraints by placing only 10× circulantSize check-node processing units (CNPUs). The CNPUs are able to process two circulant columns per clock cycle.

However, the use of irregular QC-LDPC codes with column-weights larger than 5 are being required to increase the correction capability of LDPC codes. A naïve implementation of a BF decoder will require the use of many more CNPUs to be able to process the circulant-column with the highest weight in one cycle, which will increase the hardware area significantly.

For example, existing hardware implementations for BF decoders for irregular QC LDPCs mimic the existing design for regular LDPC codes that process a fixed number of circulant-columns per cycle. If it is assumed that $d_{max}$ is the highest weight of the columns of the parity check matrix of the irregular code, then at least $2 \times d_{max} \times$circulantSize CNPUs are required in existing hardware implementations to ensure the same decoding latency per iteration. However, except when circulant columns with column-weight $d_{max}$ are being processed, this scheme results in the CN processing module remaining idle. This enormously increases the hardware area and consumes additional power.

Embodiments of the disclosed technology include a decoding scheme for irregular QC LDPCs in which: (i) the check-node (CN) and variable node (VN) variables exchange messages based on VSS scheduling, (ii) a variable speed processing scheme is used for check nodes based on the weight of the current circulant column, and (iii) extra memory is added to buffer the incoming and outgoing data in case the internal input/output (I/O) speed does not match the external I/O speed.

This design keeps the per iteration latency for decoding irregular QC-LDPC codes similar as to that of a regular LDPC BF decoder. Furthermore, it advantageously reduces the power and area required in comparison to traditional implementations described above (wherein the number of CNPUs used is based on the maximum column weight of the parity matrix of an irregular QC-LDPC code). Embodiments of the disclosed technology enable a minor increase in the number of CNPUs and the introduction of an intelligent I/O control module to manage the processing of a varying number of columns per cycle.

In an example embodiment, 12×circulantSize CNPUs are used to simultaneously process multiple circulants. For an irregular QC-LDPC code, the number of circulant-columns processed in one cycle varies according to the column-weight. In this example, one cycle may process a larger number of circulant-columns with low column-weight (e.g., four circulant-columns of weight 3) and another cycle may process a fraction of the circulant-column when the column-weight is high (e.g., half a circulant column in one cycle of weight 24). This framework advantageously ensures that the overall latency per iteration remains equal to that of the design for a regular QC-LDPC or LDPC code.

In some embodiments, if the input data rate is slower than the maximum decoder data speed, additional memory can be used to buffer the I/O when different column weights are processed. Herein, two extra input and output memory blocks of size 3×circulantSize are used to buffer the input and output data. New input data is accepted whenever the data is not available in the input buffer, and output data is sent out whenever there is no more output buffer available to store the output data.

Embodiments of the disclosed technology provide a decoding scheme for irregular QC LDPCs in which all circulant-columns are partitioned into separate zones based on the following rules:

(1) All circulant columns belonging to the same zone are processed together.

(2) The number of columns in each zone may be variable and depends on the number of available CNPUs and VNPUs, as well as the column-weights for the circulant columns in that zone.

(3) The circulant-columns in each zone are consecutive.

In some embodiments, this scheme can be used to implement a regular BF decoder, which is a special case in which the number of columns in each zone is fixed.

In some embodiments, the circulant-columns are partitioned into $\mathbb{Z} = \{Z_1, Z_2, \ldots, Z_{|\mathbb{Z}|}\}$ zones. With regard to notation, let $N_{cnpu}$ and $N_{vnpu}$ be the number of available CNPUs and VNPUs, respectively, $d_k$ be the weight of k-th circulant column, and $s_j$ and $e_j$ denote the first and last columns, respectively, belonging to the j-th zone, $Z_j = [s_j, e_j]$. The zone $Z_j$ is selected such that:

$$\sum_{l=s_j}^{e_j} d_l \le \frac{\min(N_{cnpu}, N_{vnpu})}{circSize} < \sum_{l=s_j}^{e_j+1} d_l.$$

Herein, if it is assumed that $s_0 = 0$, the boundary for all the zones can be determined.

Figure 8:
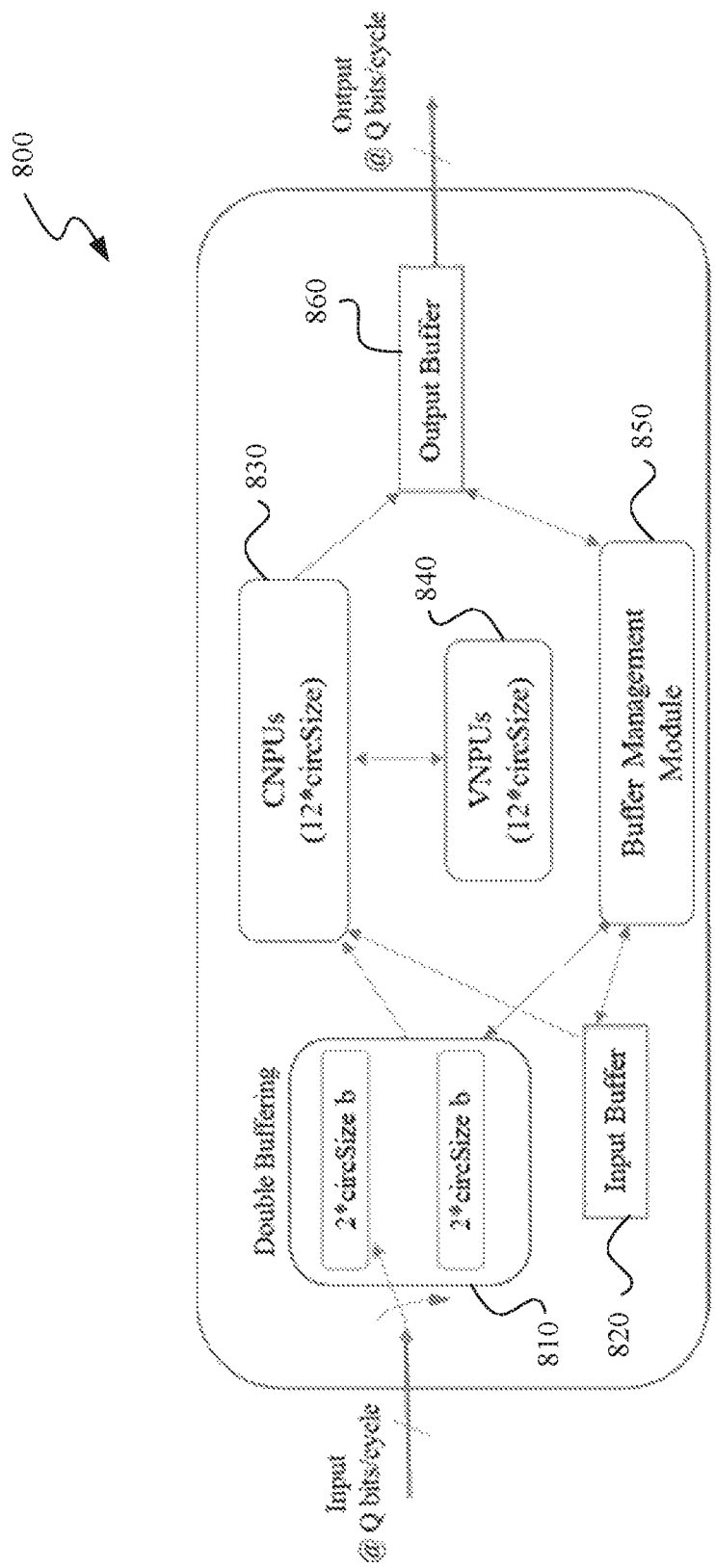
FIG. 8 illustrates an example architecture of a low-complexity bit-flipping decoder for quasi-cyclic low-density parity-check codes.

In some embodiments, and given the zone partition $\mathbb{Z} = \{Z_2, \ldots, Z_{|\mathbb{Z}|}\}$, variable-speed BF decoder scheme includes the following operations:

Iteratively:
(1) If the checksum=0 or if the maximum number of iterations has been reached→successful decoding, break;
(2) Else: for j in [1, |$\mathbb{Z}$|] (in parallel)
(2.1) Concurrently process CNPUs for circulant columns in zone $Z_j$ (2.2) Concurrently process the VNPUs for circulant columns in zone $Z_{j+1}$ FIG. 8 illustrates an example architecture 800 of a low-complexity bit-flipping decoder for irregular QC-LDPC codes. As illustrated therein, the double buffering 810 is used when the input data speed (or rate) is less than the required speed (or internal processing speed) of the irregular decoder, which is the case when the decoder processes the low column weights. However, when lower size zones (zones with large column weights) are processed, there may be additional incoming input that is not to be used in the current decoding cycle. In these cases, the additional data is stored in the input buffer 820 and is used in the next processing cycle. Similarly, the output buffer 860 can be configured to store the additional data. In another case, when the internal processing speed is higher than the external output speed, the processed data is stored in the output buffer. The buffer management module 850 is used to control when the input buffer 820 and output buffer 860 need to be used by the CNPUs 830 and VNPUs 840 in a decoding cycle.

Embodiments of the disclosed technology process a variable number of circulant-columns in a vertical shuffled schedule by dividing the circulant-columns into a number of zones based on available CNPUs and VNPUs and using an intelligent buffer management module to allow the decoder to process varying number of columns even when the input/output speeds and the size of memory accesses are not varying.

Figure 9:
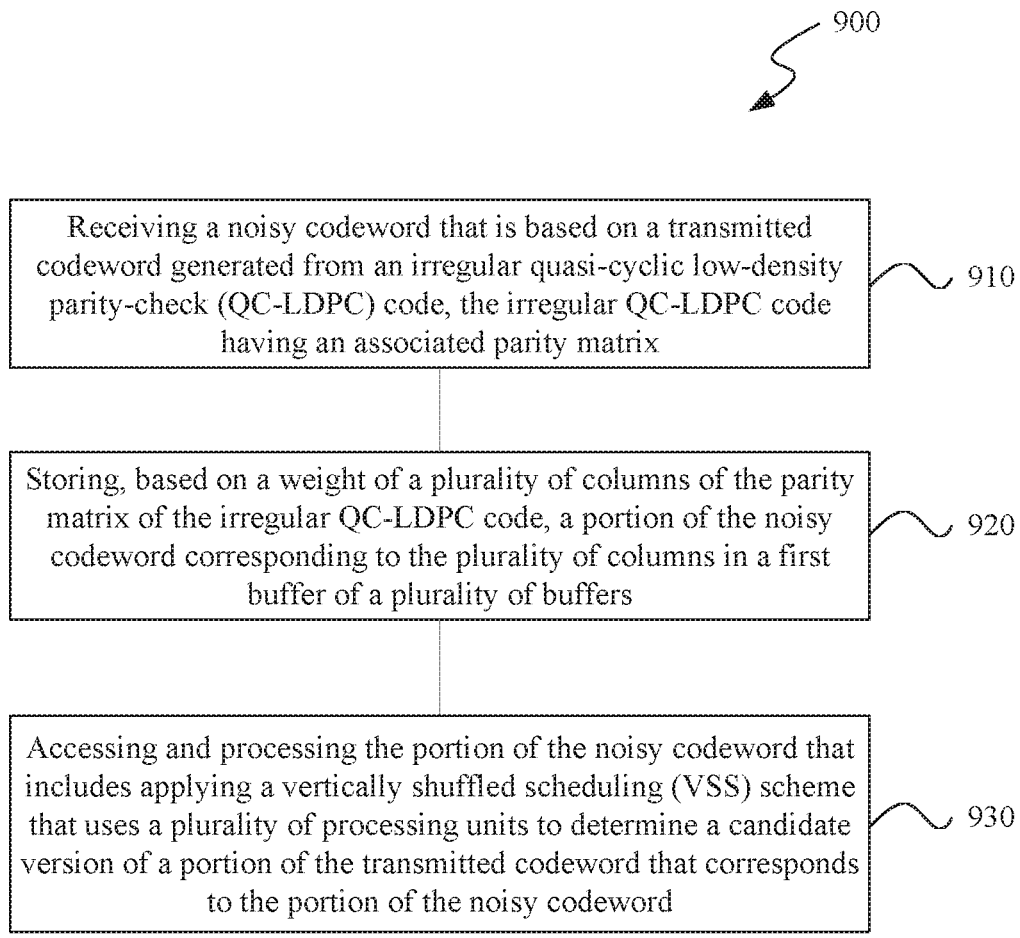
FIG. 9 illustrates a flowchart of another example method for reducing the latency of a quasi-cyclic linear code decoder.

FIG. 9 illustrates a flowchart of a method 900 for reducing the complexity of a bit-flipping decoder for QC-LDPC codes. The method 900 includes, at operation 910, receiving a noisy codeword that is based on a transmitted codeword generated from an irregular QC-LDPC code, the irregular QC-LDPC code having an associated parity matrix.

The method 900 includes, at operation 920, storing, based on a weight of a plurality of columns of the parity matrix of the irregular QC-LDPC code, a portion of the noisy codeword corresponding to the plurality of columns in a first buffer of a plurality of buffers.

The method 900 includes, at operation 930, accessing and processing the portion of the noisy codeword that includes applying a vertically shuffled scheduling (VSS) scheme that uses a plurality of processing units to determine a candidate version of a portion of the transmitted codeword that corresponds to the portion of the noisy codeword.

In some embodiments, the processing comprises a performing a message passing algorithm between a plurality of variable nodes and a plurality of check nodes that represent the parity matrix of the irregular QC-LDPC code, the VSS scheme processes each of the variable nodes one by one in each iteration of the message passing algorithm, and a number of the plurality of processing units is based on a distribution of column weights in the parity matrix.

In some embodiments, and upon a determination that the weight of the plurality of columns is smaller than an average weight of all columns of the parity matrix, the method 900 further includes the operation of using the first buffer that comprises a double buffer.

In some embodiments, and upon a determination that the weight of the plurality of columns is larger than an average weight of all columns of the parity matrix, the method 900 further includes the operation of using the first buffer that comprises an input buffer.

In some embodiments, the plurality of processing units comprises a plurality of check node processing units (CNPUs) that process each of the plurality of check nodes and a plurality of variable node processing nodes (VNPUs) that process each of the plurality of variable nodes.

In some embodiments, the parity matrix of the irregular QC-LDPC code comprises a plurality of columns of circulant matrices.

In some embodiments, the method 900 further includes the operation of partitioning the plurality of columns of circulant matrices into a plurality of zones, each comprising consecutive columns of circulant matrices, wherein the processing comprises processing each of the plurality of zones, and wherein processing a zone of the plurality of zones comprises concurrently processing all circulant columns in the zone.

In some embodiments, a number of the plurality of zones is based on a number of the plurality of CNPUs and a number of the plurality of VNPUs.

In some embodiments, the zone ($Z_j$) comprises a first column ($s_j$) and a last column ($e_j$), wherein the zone is selected such that:

$$\sum_{k=s_j}^{e_j} d_k \leq \frac{\min(N_{cnpu}, N_{vnpu})}{circSize} < \sum_{k=s_j}^{e_j+1} d_k.$$

Herein, $N_{cnpu}$ is a number of the plurality of CNPUs and $N_{vnpu}$ is a number of the plurality of VNPUs, $d_k$ is a weight of a k-th circulant column, and circSize is a size of a circulant matrix of the circulant matrices.

In some embodiments, the method 900 further includes the operation of determining, based on the candidate version of the portion of the transmitted codeword, a candidate transmitted codeword.

In some embodiments, the method 900 further includes the operation of performing a subsequent iteration of the decoder upon a determination that a checksum for the candidate transmitted codeword is not equal to zero.

In some embodiments, the method 900 further includes the operation of refraining from performing a subsequent iteration upon a determination that a checksum for the candidate transmitted codeword is equal to zero or a maximum number of iterations has been performed.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for reducing complexity of a decoder, comprising:
   receiving a noisy codeword that is based on a transmitted codeword generated from an irregular quasi-cyclic low-density parity-check (QC-LDPC) code, the irregular QC-LDPC code having an associated parity matrix;
   storing, based on comparing a weight of a plurality of columns of the parity matrix of the irregular QC-LDPC code to an average weight of all columns of the parity matrix, a portion of the noisy codeword in either a double buffer or an input buffer, the portion of the noisy codeword corresponding to the plurality of columns; and
   accessing and processing the portion of the noisy codeword that includes applying a vertically shuffled scheduling (VSS) scheme that uses a plurality of processing units to determine a candidate version of a portion of the transmitted codeword that corresponds to the portion of the noisy codeword,
   wherein the processing comprises a performing a message passing algorithm between a plurality of variable nodes and a plurality of check nodes that represent the parity matrix of the irregular QC-LDPC code,
   wherein the VSS scheme processes each of the variable nodes one by one in each iteration of the message passing algorithm, and
   wherein a number of the plurality of processing units is based on a distribution of column weights in the parity matrix.

2. The method of claim 1, wherein, upon a determination that the weight of the plurality of columns is smaller than the average weight of all columns of the parity matrix, using the double buffer to store the portion of the noisy codeword.

3. The method of claim 1, wherein, upon a determination that the weight of the plurality of columns is larger than the average weight of all columns of the parity matrix, using the input buffer to store the portion of the noisy codeword.

4. The method of claim 1, wherein the plurality of processing units comprises a plurality of check node processing units (CNPUs) that process each of the plurality of check nodes and a plurality of variable node processing nodes (VNPUs) that process each of the plurality of variable nodes.

5. The method of claim 4, wherein the parity matrix of the irregular QC-LDPC code comprises a plurality of columns of circulant matrices.

6. The method of claim 5, further comprising:
   partitioning the plurality of columns of circulant matrices into a plurality of zones, each comprising consecutive columns of circulant matrices,
   wherein the processing comprises processing each of the plurality of zones, and
   wherein processing a zone of the plurality of zones comprises concurrently processing all circulant columns in the zone.

7. The method of claim 6, wherein a number of the plurality of zones is based on a number of the plurality of CNPUs and a number of the plurality of VNPUs.

8. The method of claim 6, wherein the zone ($Z_j$) comprises a first column ($s_j$) and a last column ($e_j$), wherein the zone is selected such that:

$$\sum_{k=s_j}^{e_j} d_k \leq \frac{\min(N_{cnpu}, N_{vnpu})}{circSize} < \sum_{k=s_j}^{e_j+1} d_k$$

wherein $N_{cnpu}$ is a number of the plurality of CNPUs and $N_{vnpu}$ is a number of the plurality of VNPUs, wherein $d_k$ is a weight of a k-th circulant column, and wherein circSize is a size of a circulant matrix of the circulant matrices.

9. The method of claim 1, further comprising:
determining, based on the candidate version of the portion of the transmitted codeword, a candidate transmitted codeword.

10. The method of claim 9, further comprising:
performing a subsequent iteration of the decoder upon a determination that a checksum for the candidate transmitted codeword is not equal to zero.

11. The method of claim 9, further comprising:
refraining from performing a subsequent iteration upon a determination that a checksum for the candidate transmitted codeword is equal to zero or a maximum number of iterations has been performed.

12. A system for reducing complexity of a decoder, comprising:
a processor and a memory including instructions stored thereupon, wherein the instructions upon execution by the processor cause the processor to:
receive a noisy codeword that is based on a transmitted codeword generated from an irregular quasi-cyclic low-density parity-check (QC-LDPC) code, the irregular QC-LDPC code having an associated parity matrix;
store, based on comparing a weight of a plurality of columns of the parity matrix of the irregular QC-LDPC code to an average weight of all columns of the parity matrix, a portion of the noisy codeword in either a double buffer or an input buffer, the portion of the noisy codeword corresponding to the plurality of columns; and
access and process the portion of the noisy codeword that includes applying a vertically shuffled scheduling (VSS) scheme that uses a plurality of processing units to determine a candidate version of a portion of the transmitted codeword that corresponds to the portion of the noisy codeword,
wherein the processing comprises a performing a message passing algorithm between a plurality of variable nodes and a plurality of check nodes that represent the parity matrix of the irregular QC-LDPC code,
wherein the VSS scheme processes each of the variable nodes one by one in each iteration of the message passing algorithm, and
wherein a number of the plurality of processing units is based on a distribution of column weights in the parity matrix.

13. The system of claim 12, wherein, upon a determination that the weight of the plurality of columns is smaller than the average weight of all columns of the parity matrix, the processor is further configured to:
use the double buffer to store the portion of the noisy codeword.

14. The system of claim 12, wherein, upon a determination that the weight of the plurality of columns is larger than the average weight of all columns of the parity matrix, the processor is further configured to:
use the input buffer to store the portion of the noisy codeword.

15. The system of claim 12, wherein the plurality of processing units comprises a plurality of check node processing units (CNPUs) that process each of the plurality of check nodes and a plurality of variable node processing nodes (VNPUs) that process each of the plurality of variable nodes.

16. A non-transitory computer-readable storage medium having instructions stored thereupon for reducing complexity of a decoder, comprising:
instructions for receiving a noisy codeword that is based on a transmitted codeword generated from an irregular quasi-cyclic low-density parity-check (QC-LDPC) code, the irregular QC-LDPC code having an associated parity matrix;
instructions for storing, based on comparing a weight of a plurality of columns of the parity matrix of the irregular QC-LDPC code to an average weight of all columns of the parity matrix, a portion of the noisy codeword in a double buffer or an input buffer, the portion of the noisy codeword corresponding to the plurality of columns; and
instructions for accessing and processing the portion of the noisy codeword that includes applying a vertically shuffled scheduling (VSS) scheme that uses a plurality of processing units to determine a candidate version of a portion of the transmitted codeword that corresponds to the portion of the noisy codeword,
wherein the processing comprises a performing a message passing algorithm between a plurality of variable nodes and a plurality of check nodes that represent the parity matrix of the irregular QC-LDPC code,
wherein the VSS scheme processes each of the variable nodes one by one in each iteration of the message passing algorithm, and
wherein a number of the plurality of processing units is based on a distribution of column weights in the parity matrix.

17. The computer-readable storage medium of claim 16, wherein the plurality of processing units comprises a plurality of check node processing units (CNPUs) that process each of the plurality of check nodes and a plurality of variable node processing nodes (VNPUs) that process each of the plurality of variable nodes.

18. The computer-readable storage medium of claim 17, wherein the parity matrix of the irregular QC-LDPC code comprises a plurality of columns of circulant matrices.

19. The computer-readable storage medium of claim 18, further comprising:
instructions for partitioning the plurality of columns of circulant matrices into a plurality of zones, each comprising consecutive columns of circulant matrices,
wherein the processing comprises processing each of the plurality of zones, and
wherein processing a zone of the plurality of zones comprises concurrently processing all circulant columns in the zone.

20. The computer-readable storage medium of claim 19, wherein a number of the plurality of zones is based on a number of the plurality of CNPUs and a number of the plurality of VNPUs.

* * * * *